(12) United States Patent
Zhu et al.

(10) Patent No.: US 11,893,930 B2
(45) Date of Patent: *Feb. 6, 2024

(54) ARRAY SUBSTRATE, DISPLAY PANEL, AND DISPLAY DEVICE

(71) Applicant: BOE Technology Group Co., Ltd., Beijing (CN)

(72) Inventors: Xiaoyan Zhu, Beijing (CN); Hua Huang, Beijing (CN); Guangcai Yuan, Beijing (CN); Xue Dong, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/896,270

(22) Filed: Aug. 26, 2022

(65) Prior Publication Data
US 2022/0415253 A1 Dec. 29, 2022

Related U.S. Application Data

(63) Continuation of application No. 17/256,039, filed as application No. PCT/CN2019/116824 on Nov. 8, 2019, now Pat. No. 11,468,832.

(51) Int. Cl.
G09G 3/3225 (2016.01)
G09G 3/36 (2006.01)
(Continued)

(52) U.S. Cl.
CPC ......... *G09G 3/3225* (2013.01); *G09G 3/3648* (2013.01); *H01L 25/0753* (2013.01);
(Continued)

(58) Field of Classification Search
CPC . H01L 27/1218; H01L 33/60; H01L 25/0753; H01L 27/1259; H01L 33/62;
(Continued)

(56) References Cited

U.S. PATENT DOCUMENTS 9,287,329 B1* 3/2016 Lee .................... H10K 50/8426
9,356,087 B1 5/2016 Lee et al.
(Continued)

FOREIGN PATENT DOCUMENTS

CN 104317080 A 1/2015
CN 106023811 A 10/2016
(Continued)

OTHER PUBLICATIONS

International search report of PCT application No. PCT/CN2019/116824 dated Jul. 24, 2020.
(Continued)

*Primary Examiner* — Vinh T Lam
(74) *Attorney, Agent, or Firm* — Lippes Mathias LLP

(57) ABSTRACT

An array substrate includes a base substrate, a pixel circuit, a flexible layer, a lead structure, a control circuit and a planarization layer. The flexible layer includes a first substrate portion and a second substrate portion, and the lead structure includes a first lead portion and a second lead portion. The pixel circuit, the first lead portion and the first substrate portion are all arranged on a first side of the base substrate, the control circuit, the second lead portion and the second substrate portion are all arranged on a second side of the base substrate, and the second side is opposite to the first side.

20 Claims, 10 Drawing Sheets

(51) Int. Cl.
  *H01L 27/12* (2006.01)
  *H01L 25/075* (2006.01)
  *H01L 33/60* (2010.01)
  *H01L 33/62* (2010.01)
  *H10K 77/10* (2023.01)

(52) U.S. Cl.
  CPC ...... *H01L 27/1218* (2013.01); *H01L 27/1259* (2013.01); *H01L 33/60* (2013.01); *H01L 33/62* (2013.01); *H10K 77/111* (2023.02); *H01L 2933/0058* (2013.01); *H01L 2933/0066* (2013.01)

(58) Field of Classification Search
  CPC .... H01L 2933/0066; H01L 2933/0058; G09G 3/3648; G09G 3/3225; H10K 77/111; H10K 59/13; H10K 2102/311; G09F 9/33; G09F 9/30; Y02P 70/50
  See application file for complete search history.

(56) References Cited

U.S. PATENT DOCUMENTS

| | | | |
|---|---|---|---|
| 9,748,275 B2* | 8/2017 | Miyaguchi | H01L 27/1218 |
| 9,806,284 B2 | 10/2017 | Goto et al. | |
| 9,989,791 B2 | 6/2018 | Cheng | |
| 10,147,742 B2* | 12/2018 | Miyaguchi | G06F 1/1652 |
| 10,224,344 B2 | 3/2019 | Lee et al. | |
| 10,244,622 B2 | 3/2019 | Kim et al. | |
| 10,270,059 B2 | 4/2019 | Kim | |
| 10,276,810 B2 | 4/2019 | Kim et al. | |
| 10,319,799 B2* | 6/2019 | Nishinohara | H10K 50/8445 |
| 10,361,221 B2 | 7/2019 | Miyaguchi | |
| 10,388,713 B2 | 8/2019 | Son et al. | |
| 10,429,986 B2 | 10/2019 | Kim et al. | |
| 10,451,908 B2 | 10/2019 | Jin et al. | |
| 10,459,303 B2* | 10/2019 | Oka | G02B 6/009 |
| 10,481,728 B2* | 11/2019 | Kim | G02F 1/133305 |
| 10,490,759 B2* | 11/2019 | Choi | H10K 50/844 |
| 10,529,746 B2* | 1/2020 | Bae | H05K 1/189 |
| 10,555,414 B2 | 2/2020 | Park et al. | |
| 10,658,436 B2 | 5/2020 | Shin et al. | |
| 10,680,200 B2 | 6/2020 | Namkung | |
| 10,692,891 B2 | 6/2020 | Miyaguchi | |
| 10,693,089 B2 | 6/2020 | He et al. | |
| 10,734,462 B2* | 8/2020 | Nishinohara | H10K 59/131 |
| 10,747,351 B2 | 8/2020 | Kim et al. | |
| 10,777,101 B2* | 9/2020 | Park | G09F 9/301 |
| 10,811,488 B2* | 10/2020 | Matsui | G09F 9/30 |
| 10,838,113 B2 | 11/2020 | Kwon et al. | |
| 10,847,545 B2 | 11/2020 | Lee et al. | |
| 10,863,619 B2* | 12/2020 | Lee | H10K 50/865 |
| 10,866,444 B2* | 12/2020 | You | G02F 1/133528 |
| 10,869,388 B2 | 12/2020 | Park et al. | |
| 10,873,043 B2* | 12/2020 | Jin | H10K 50/86 |
| 10,879,213 B2 | 12/2020 | Kim et al. | |
| 10,892,257 B2 | 1/2021 | Wu et al. | |
| 10,897,019 B2* | 1/2021 | Seo | H10K 50/844 |
| 10,903,457 B2 | 1/2021 | Cho et al. | |
| 10,910,592 B2 | 2/2021 | Kuon et al. | |
| 10,997,881 B2 | 5/2021 | Shin et al. | |
| 11,024,225 B2* | 6/2021 | Yang | H10K 59/124 |
| 11,043,547 B2 | 6/2021 | Xu | |
| 11,049,914 B2* | 6/2021 | Li | G06F 3/0412 |
| 11,069,762 B2 | 7/2021 | Chung et al. | |
| 11,113,996 B2* | 9/2021 | Kim | G06F 1/16 |
| 11,121,202 B2* | 9/2021 | Jang | H10K 77/111 |
| 11,189,646 B2* | 11/2021 | Ding | H01L 27/127 |
| 11,232,722 B2* | 1/2022 | Park | H10K 59/122 |
| 11,329,068 B2 | 5/2022 | Baek | |
| 11,342,518 B2* | 5/2022 | Kim | H10K 59/131 |
| 11,342,521 B2* | 5/2022 | Fujiwara | H10K 71/00 |
| 11,468,832 B2* | 10/2022 | Zhu | H10K 77/111 |
| 11,569,274 B2* | 1/2023 | Zhang | H01L 27/124 |
| 2005/0122700 A1 | 6/2005 | Kim et al. | |
| 2015/0060931 A1 | 3/2015 | Jung | |
| 2016/0093644 A1 | 3/2016 | Ki et al. | |
| 2016/0093685 A1 | 3/2016 | Kwon et al. | |
| 2016/0105950 A1 | 4/2016 | Drzaic et al. | |
| 2016/0155788 A1 | 6/2016 | Kwon et al. | |
| 2016/0172428 A1 | 6/2016 | Song | |
| 2016/0181346 A1 | 6/2016 | Kwon et al. | |
| 2016/0254278 A1 | 9/2016 | Miyaguchi | |
| 2016/0293869 A1 | 10/2016 | Saeki et al. | |
| 2017/0062760 A1 | 3/2017 | Kim | |
| 2017/0117346 A1 | 4/2017 | Kim | |
| 2017/0179215 A1 | 6/2017 | Kwon et al. | |
| 2017/0301267 A1 | 10/2017 | Cai | |
| 2018/0006266 A1 | 1/2018 | Oh | |
| 2018/0083210 A1 | 3/2018 | Choi et al. | |
| 2018/0101200 A1 | 4/2018 | Myeong et al. | |
| 2018/0123060 A1 | 5/2018 | Jang et al. | |
| 2018/0358385 A1* | 12/2018 | Bae | H01L 23/482 |
| 2019/0025620 A1* | 1/2019 | Tuan | G02F 1/136 |
| 2019/0027504 A1 | 1/2019 | Miyaguchi | |
| 2019/0051858 A1 | 2/2019 | Tomioka et al. | |
| 2019/0138258 A1 | 5/2019 | Cope et al. | |
| 2019/0179470 A1 | 6/2019 | Hong et al. | |
| 2019/0229171 A1 | 7/2019 | Nishinohara | |
| 2019/0230783 A1 | 7/2019 | Park et al. | |
| 2019/0305073 A1 | 10/2019 | Chen et al. | |
| 2019/0310302 A1 | 10/2019 | Lee et al. | |
| 2019/0369776 A1 | 12/2019 | Wu et al. | |
| 2020/0006391 A1 | 1/2020 | Miyaguchi | |
| 2020/0091446 A1 | 3/2020 | Seo et al. | |
| 2020/0111978 A1* | 4/2020 | Kim | H10K 77/111 |
| 2020/0119124 A1 | 4/2020 | Ahn et al. | |
| 2020/0150481 A1 | 5/2020 | You et al. | |
| 2020/0211941 A1 | 7/2020 | Xi | |
| 2020/0271977 A1 | 8/2020 | Chen et al. | |
| 2020/0295282 A1 | 9/2020 | Xiang | |
| 2020/0341516 A1 | 10/2020 | Huang et al. | |
| 2020/0381386 A1 | 12/2020 | Chae | |
| 2021/0296394 A1* | 9/2021 | Meng | H01L 27/156 |

FOREIGN PATENT DOCUMENTS

| | | |
|---|---|---|
| CN | 106486520 A | 3/2017 |
| CN | 106611773 A | 5/2017 |
| CN | 106653777 A | 5/2017 |
| CN | 106782091 A | 5/2017 |
| CN | 106992259 A | 7/2017 |
| CN | 107403590 A | 11/2017 |
| CN | 107871751 A | 4/2018 |
| CN | 107919062 A | 4/2018 |
| CN | 108681123 A | 10/2018 |
| CN | 108878483 A | 11/2018 |
| CN | 109285452 A | 1/2019 |
| CN | 109559639 A | 4/2019 |
| CN | 109559646 A | 4/2019 |
| CN | 109671753 A | 4/2019 |
| CN | 107004774 B | 5/2019 |
| CN | 109917953 A | 6/2019 |
| CN | 110164901 A | 8/2019 |
| CN | 106796949 B | 10/2019 |
| CN | 108231800 B | 10/2019 |
| CN | 110297346 A | 10/2019 |
| CN | 110308579 A | 10/2019 |
| CN | 110347277 A | 10/2019 |
| CN | 110503898 A | 11/2019 |
| CN | 210072572 U | 2/2020 |
| CN | 107004694 B | 9/2021 |
| DE | 102016015592 B4 | 7/2020 |
| EP | 3318921 B1 | 10/2019 |
| JP | 2017069546 A | 4/2017 |
| WO | 2019187452 A1 | 10/2019 |

OTHER PUBLICATIONS

International search report of PCT application No. PCT/CN2020/076268 dated Aug. 5, 2020.
China National Intellectual Property Administration, First office action of Chinese application No. 202080000171.8 dated Nov. 3,

(56) References Cited

OTHER PUBLICATIONS 2021, which is foreign counterpart application of this US application.
Examination report of counterpart Indian application No. 202147051414 dated Jun. 10, 2022.
Notice of allowance of U.S. Appl. No. 17/256,039 dated Jun. 6, 2022.
Corrected Notice of allowance of U.S. Appl. No. 17/256,039 dated Jun. 14, 2022.
Restriction Requirement of U.S. Appl. No. 17/281,872 dated May 31, 2023.
Non-final Action of U.S. Appl. No. 17/281,872 dated Sep. 12, 2023.
Notice of Reasons for Refusal of Japanese application No. 2021-568080 dated Oct. 30, 2023.

* cited by examiner

Forming a base substrate, a pixel circuit, a lead structure, a flexible layer, a control circuit and a planarization layer, wherein the pixel circuit, the flexible layer, the control circuit and the planarization layer are all arranged on a first side of the base substrate; an orthographic projection of the flexible layer on a reference plane parallel to the base substrate overlaps an orthographic projection portion of the base substrate on the reference plane; the lead structure covers a side, distal from the base substrate, of the flexible layer and is electrically connected to both the pixel circuit and the control circuit; the planarization layer is arranged on a side, distal from the base substrate, of the pixel circuit and covers the pixel circuit and a portion, distal from the control circuit, in the lead structure. — 901

Curving the flexible layer and the lead structure to enable the control circuit to move from the first side of the base substrate to a second side of the base substrate, wherein the second side is opposite to the first side, the curved flexible layer includes a first substrate portion, a curved substrate portion and a second substrate portion which are sequentially connected, the first substrate portion is arranged on the first side of the base substrate, the curved substrate portion is curved from the first side of the base substrate to the second side, and the second substrate portion is arranged on the second side of the base substrate; and the curved lead structure includes a first lead portion, a curved lead portion and a second lead portion which are sequentially connected, the first lead portion is arranged on a side, distal from the base substrate, of the first substrate portion and is electrically connected to the pixel circuit, the curved lead portion is arranged on a side, distal from the base substrate, of the curved substrate portion, the second lead portion is arranged on a side, distal from the base substrate, of the second substrate portion, and the curved planarization layer covers the pixel circuit, the first lead portion and the curved lead portion. — 902

FIG. 9

ARRAY SUBSTRATE, DISPLAY PANEL, AND DISPLAY DEVICE

CROSS-REFERENCE TO RELATED APPLICATION

This application is a continuation of U.S. application Ser. No. 17/256,039, filed on Dec. 24, 2020, which is a 371 of PCT Application No. PCT/CN2019/116824, filed on Nov. 8, 2019, the entire contents of which are incorporated herein by reference,

TECHNICAL FIELD

The present disclosure relates to the field of display technologies, in particular to an array substrate, a display panel, and a display device.

BACKGROUND

The display panel includes a display region and a non-display region, and an area ratio of the display region to the display panel is defined as a screen-to-body ratio. The larger the screen-to-body ratio of the display panel is, the better the display effect of the display panel is.

In the related art, the screen-to-body ratio of the display panel is increased by reducing a width of the non-display region.

SUMMARY

In the first aspect, an embodiment of the present disclosure provides an array substrate, including: a base substrate, a lead structure, a control circuit, and a flexible layer; wherein the flexible layer includes a first substrate portion, a curved substrate portion and a second substrate portion which are sequentially connected, a first substrate portion is arranged on a first side of the base substrate, the curved substrate portion is curved from the first side of the base substrate to a second side, and the second substrate portion is arranged on the second side of the base substrate, the second side is opposite to the first side;

the lead structure includes a first lead portion, a curved lead portion and a second lead portion which are sequentially connected, the first lead portion is arranged on a side, distal from the base substrate, of the first substrate portion and is electrically connected to the pixel circuit, the curved lead portion is arranged on a side, distal from the base substrate, of the curved substrate portion, and the second lead portion is arranged on a side, distal from the base substrate, of the second substrate portion and is electrically connected to the control circuit arranged on the second side of the base substrate.

In the second aspect, the embodiment of the present disclosure provides a display panel, including the above-mentioned array substrate.

In the third aspect, an embodiment of the present disclosure provides a display device, including the above-mentioned display panel.

BRIEF DESCRIPTION OF THE DRAWINGS

FIG. 9 is a schematic flowchart of a method for manufacturing an array substrate according to an embodiment of the present disclosure;

DETAILED DESCRIPTION

To make the principles, technical solutions, and advantages of the present disclosure clearer, the implementation manners of the present disclosure are described below in detail with reference to the accompanying drawings.

In related art, a non-display region in a display panel is relatively wide to enable a screen-to-body ratio of the display panel to be relatively small. The embodiment of the present disclosure provides an array substrate to be capable of solving the problem of relatively small screen-to-body ratio of the display panel.

Figure 1:
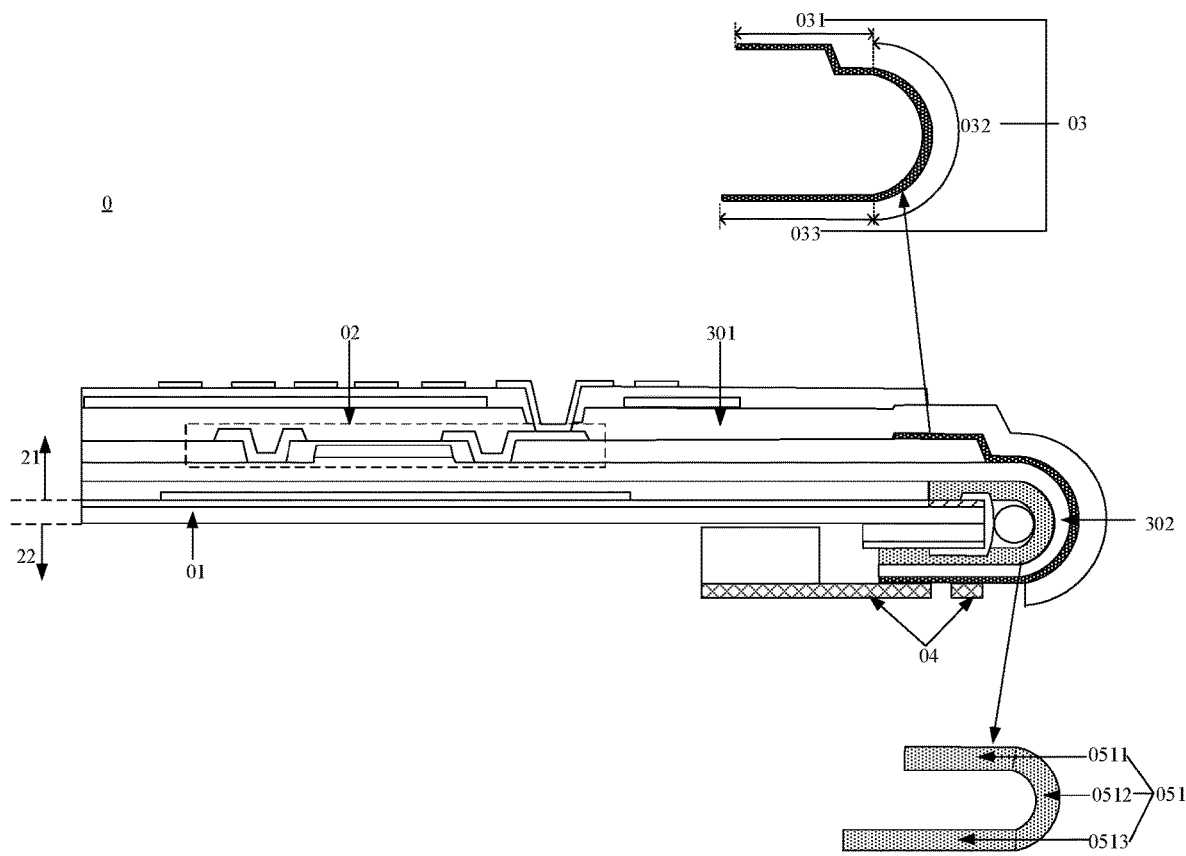
FIG. 1 is a schematic diagram showing a partial structure of an array substrate according to an embodiment of the present disclosure.

FIG. 1 is a schematic structural diagram of an array substrate according to an embodiment of the present disclosure; and as illustrated in FIG. 1, an array substrate 0 includes: a base substrate 01, a pixel circuit 02, a lead structure 03, a control circuit 04, a flexible layer 051 and a planarization layer 301.

The flexible layer 051 includes a first substrate portion 0511, a curved substrate portion 0512 and a second substrate portion 0513 which are sequentially connected, the pixel circuit 02 and a first substrate portion 0511 are both arranged on a first side 21 of the base substrate 01, the curved substrate portion 0512 is curved from the first side 21 of the base substrate 01 to a second side 22, and the second substrate portion 0513 is arranged on the second side 22 of the base substrate 01, and the second side 2 is opposite to the first side 21.

The lead structure 03 includes a first lead portion 031, a curved lead portion 032 and a second lead portion 033 which are sequentially connected, the first lead portion 031 is arranged on a side, distal from the base substrate 01, of the first substrate portion 0511 and is electrically connected to the pixel circuit 02, the curved lead portion 032 is arranged on a side, distal from the base substrate 01, of the curved substrate portion 0512, and the second lead portion 033 is arranged on a side, distal from the base substrate 01, of the second substrate portion 0513 and is electrically connected to the control circuit 04 arranged on the second side 22 of the base substrate 01.

The planarization layer 301 is arranged on a side, distal from the base substrate 01, of the pixel circuit 02 and covers the pixel circuit 02, the first lead portion 031 and the curved lead portion 032. A side, distal from the base substrate, of the planarization layer 301 is relatively flat, such that a segment difference between other structures formed on the planarization layer 301 is relatively small.

To sum up, in the array substrate provided by the embodiment of the present disclosure, a portion of the flexible layer is fixed to the first side of the base substrate, and the other portion of the flexible layer is curved to the second side, opposite to the first side, in the base substrate. In this way, the lead structure on the flexible layer may also be curved to the second side of the base substrate along with curving of the flexible layer, and thus a width of a portion of the first side of the base substrate that is occupied by the lead structure may be reduced, and the purpose of increasing the screen-to-body ratio by reducing a width of the non-display region of the base substrate is achieved.

It should be noted that electrical connection of two structures refers to that conductive portions in the two structures are mutually connected, a current may be transferred between the two structures, but whether the current flows between the two structures is not defined. For example, electrical connection of the second lead portion 033 and the control circuit 04 refers to that a current may be transferred between the second lead portion 033 and the control circuit 04. The pixel circuit may be an active pixel circuit (for example, a pixel circuit including a thin film transistor) or a passive pixel circuit (for example, a pixel circuit merely including a trace), and this is not limited in this embodiment.

Optionally, the base substrate 011 may be a rigid substrate, for example, the base substrate may be a glass substrate, a transparent resin substrate or the like.

Optionally, continuing with reference to FIG. 1, the array substrate further includes an auxiliary film layer 302 arranged between the flexible layer 051 and the lead structure 03. The auxiliary film layer 302 can protect the lead structure 03, isolate the lead structure 03 from the flexible layer 051, and thus block the lead structure 03 from being in contact with water and oxygen, and a failure of the lead structure 03 under the effects of the water and the oxygen is avoided. For example, the auxiliary film layer 302 may be made of an insulating material, a conductive material or a semiconductor material, and this is not limited in this embodiment. The insulating material may be silicon oxide, silicon nitride and the like.

Figure 2:
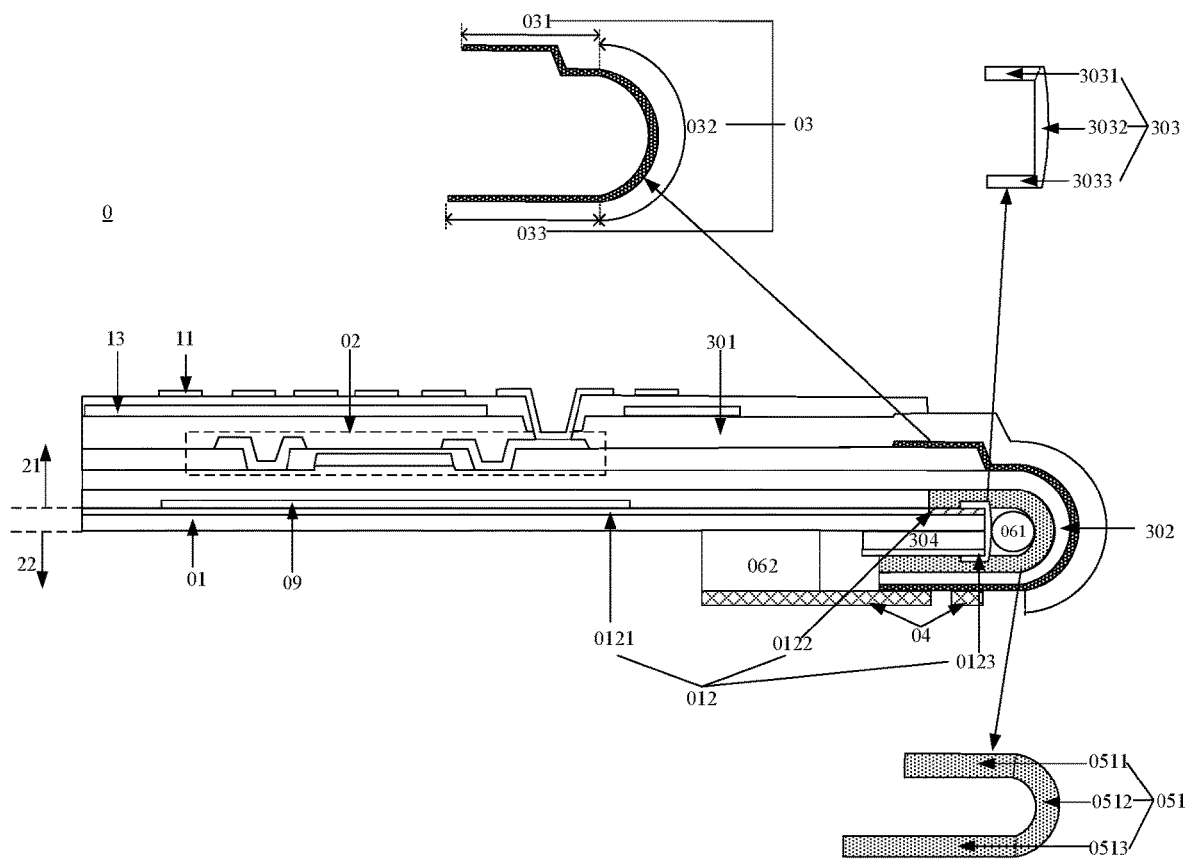
FIG. 2 is a schematic diagram showing a partial structure of another array substrate according to an embodiment of the present disclosure.
Figure 3:
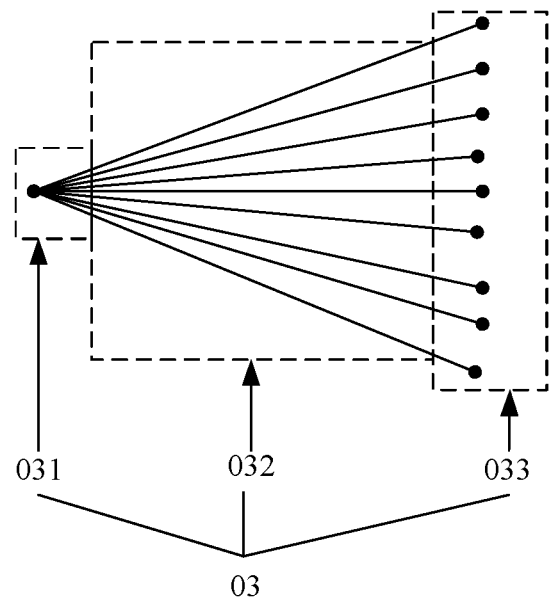
FIG. 3 is a schematic developed view of a lead structure in FIG. 2.

FIG. 2 is a schematic diagram showing a partial structure of another array substrate according to an embodiment of the present disclosure, and the schematic developed view of the lead structure in the FIG. 2 may be as shown in FIG. 3. As seen from FIG. 3, the lead structure 03 includes multiple leads arranged in a fan shape and includes a first lead portion 031, a curved lead portion 032 and a second lead portion 033 which are sequentially connected. The curved lead portion 032 is arranged in a fan-out region in the lead structure 03, a convergent end in the curved lead portion 032 is connected to the first lead portion 031, and a dispersive end in the curved lead portion 032 is connected to the second lead portion 033. It needs to be noted that the second lead portion 033 is provided with pins electrically connected to the control circuit.

Optionally, continuing with reference to FIG. 2, the base substrate 01 may further include: a target cushion layer 012. The target cushion layer 012 is arranged on the first side 21 of the base substrate 01, and the pixel circuit 02 is arranged on a side, distal from the base substrate 01, of the target cushion layer 012. The target cushion layer 012 includes a first cushion layer portion 0121 and a second cushion layer portion 0122, and a viscosity of the second cushion layer portion 0122 is larger than that of the first cushion layer portion 0121. Optionally, the array substrate may not include the target cushion layer 012, which is not limited in this embodiment of the present disclosure.

It needs to be noted that the pixel circuit 02 is arranged on a side, distal from the base substrate 01, of the first cushion layer portion 0121 of the target cushion layer 012, and the first substrate portion 0511 in the flexible layer 051 may be partially or wholly arranged on a side, distal from the base substrate 01, of the second cushion layer portion 0122 of the target cushion layer, which is not limited in this embodiment of the present disclosure. In the embodiment of the present disclosure, the situation that the first substrate portion 0511 in the flexible layer 051 is wholly arranged on the side, distal from the base substrate 01, of the second cushion layer portion 0122 of the target cushion layer 012 is taken as an example. The flexible layer 051 may be fastened on the base substrate 01 by the second cushion layer portion 0122 to realize the stability of electrical connection of the first side 21 of the base substrate.

Optionally, one end, proximal to the first cushion layer portion 0121, of the second cushion layer portion 0122 in the target cushion layer 012 may be or not be flush with one end, proximal to the first cushion layer portion 0121, of the first substrate portion 0511 in the flexible layer 051, and one end, distal from the first cushion layer portion 0121, of the second cushion layer portion 0122 in the target cushion layer 012 may be or not be flush with one end, distal from the first cushion layer portion 0121, of the base substrate 01, which is not limited in the embodiment of the present disclosure. In the embodiment of the present disclosure, the situation that one end, proximal to the first cushion layer portion 0121, of the second cushion layer portion 0122 is flush with one end, proximal to the first cushion layer portion 0121, of the first substrate portion 0511 in the flexible layer 051, and one end, distal from the first cushion layer portion 0121, of the second cushion layer portion 0122 is flush with one end, distal from the first cushion layer portion 0121, of the base substrate 01 is taken as an example.

Figure 4A:
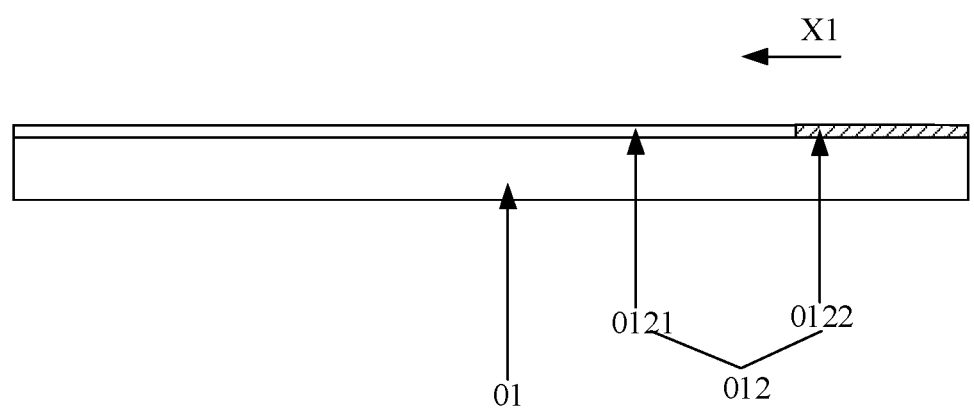
FIG. 4A is a schematic developed view of a part of the structure in FIG. 2.

Optionally, FIG. 4A is a schematic diagram of a part of a structure in FIG. 2; and combining FIG. 2 with FIG. 4A, a length of the second cushion layer portion 0122 in a direction X1 toward the first cushion layer portion 0121 may range from 0.1 mm to 0.5 mm. At the time, a length of the first substrate portion 0511 in the flexible layer 051 may range from 0.1 mm to 0.5 mm m in the direction X1. Furthermore, a length of the first lead portion 031, arranged on the flexible layer 051, in the lead structure 03 (a length of the first lead portion in the direction X1) may range from 0.1 mm to 0.5 mm. In this way, after the flexible layer 051 is curved, lengths of the flexible layer 051 and the lead structure 03 arranged on the flexible layer 051 may be equal to 0.1 mm on the first side 21 of the base substrate 01, and thus the screen-to-body ratio of the display panel is greatly increased. It needs to be noted that, when the curved substrate portion 0512 in the flexible layer is in contact with the base substrate 01, the lengths of the flexible layer and the lead structure arranged on the flexible layer may be even smaller than 0.1 mm on the first side 21 of the base substrate.

Continuing with reference to FIG. 2, the array substrate further includes an adhesive 303. The adhesive 303 includes a first adhesive portion 3031, a second adhesive portion 3032 and a third adhesive portion 3033 which are sequentially connected. The first adhesive portion 3031 is arranged between the base substrate 01 and the first substrate portion 0511, the second adhesive portion 3032 is arranged between the base substrate 01 and the curved substrate portion 0512, and the third adhesive portion 3033 is arranged between the base substrate 01 and the second substrate portion 0513. The adhesive 303 may adhere the flexible layer 051 to the base substrate 01 together to prevent the flexible layer 051 from being departed from the base substrate 01. Furthermore, the adhesive 303 has a certain thickness and may protect the flexible layer 051 from being broken under the effect of the base substrate 01. Optionally, the thickness of the adhesive 303 may range from 5 micrometers to 30 micrometers, for example, the thickness of the adhesive 303 is 20 micrometers. Optionally, the array substrate may not include the adhesive 303, which is not limited in this embodiment of the present disclosure.

Optionally, continuing with reference to FIG. 2, as seen from FIG. 2, the array substrate 01 further includes a first buffer structure 061, and the first buffer structure 061 is arranged between the second adhesive portion 3032 in the adhesive 303 and the curved substrate portion 0512 in the flexible layer 051. It needs to be noted that, the first buffer structure 061 may prevent the condition that the flexible layer 051 cracks or is broken due to uneven stress when the flexible layer 051 is curved. Furthermore, after the flexible layer 051 is curved, with presence of the first buffer structure 061, the curved substrate portion 0512 in the flexible layer 051 cannot be deformed and broken when an external force is applied to the curved substrate portion 0512 and thus may be stabilized. Certainly, the array substrate 0 also may not include the first buffer structure 061, and in that case, the structure of the array substrate 0 may be as shown in FIG. 4B.

Optionally, a surface, distal from a side of the base substrate 01, of the first buffer structure 061 is a cambered surface and is matched with a curved portion in the flexible layer 051. For example, the first buffer structure 061 may be a semi-cylinder or a cylinder or may be in a sphere shape. Optionally, when the first buffer structure 061 is in the sphere shape, a diameter of the first buffer structure 061 may be smaller than or equal to a minimal distance between a surface on the first side 21 and a surface on the second side 22 in the base substrate 01, and in this case, a buffer effect of the first buffer structure is better. It needs to be noted that, the first buffer structure 061 may be made of foams, plastics or a flexible material or the like.

Optionally, the array substrate 0 further includes a second buffer structure 062, the second buffer structure 062 is arranged on the second side 22 of the base substrate 01, and the control circuit 04 is arranged on a side, distal from the base substrate 01, of the second buffer structure 062. An orthographic projection of the second buffer structure 062 on the base substrate 01 has an overlapping region with an orthographic projection of the control circuit 04 on the base substrate 01. Optionally, a surface, distal from the base substrate 01, of the second buffer structure 062 may be or not be parallel to a surface, proximal to the second buffer structure 062, in the base substrate, which is not limited in the embodiment of the present disclosure. In the embodiment of the present disclosure, the situation that the surface, distal from the base substrate 01, of the second buffer structure 062 is parallel to the surface, proximal to the second buffer structure 062, in the base substrate is taken as an example. It needs to be noted that, the second buffer structure 062 may buffer the control circuit when the control circuit 04 is curved to the second side 22 of the base substrate 01 to prevent the problem that the deformation degree of the control circuit is too large to cause poor effect in electrical connection of the control circuit 04 and the lead structure 03. Optionally, the array substrate may not include the second buffer structure 062, which is not limited in the embodiment of the present disclosure.

Figure 4B:
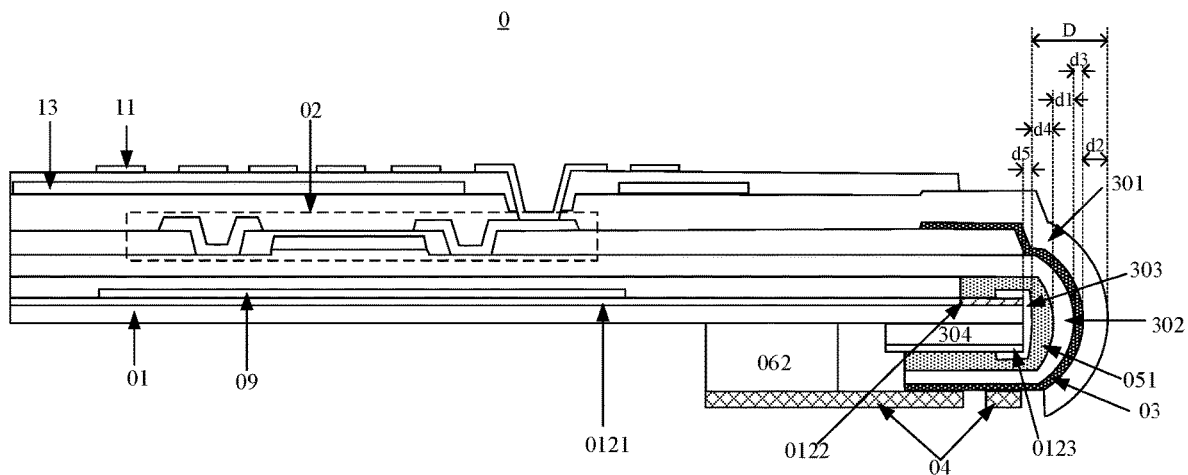
FIG. 4B is a diagram showing a partial structure of another array substrate according to an embodiment of the present disclosure.

Optionally, continuing with reference to FIG. 4B, in the embodiment of the present disclosure, an edge of the array substrate may be relatively narrow by ensuring that at least one of a thickness d1 of the auxiliary film layer 302, a thickness d2 of the planarization layer 301, a thickness d3 of the lead structure 03, a thickness d4 of the flexible layer 051 and a thickness d5 of the adhesive 303 is relatively small. When the display panel, on which the array substrate is disposed, needs to be spliced to other display panels, a spliced seam (which can be seen as a seam between display regions of two display panels) between the display panels is relatively narrow, and thus the splicing effect of the display panel is improved.

For example, the thickness d1 of the auxiliary film layer 302 may range from 1000 angstroms to 3000 angstroms, for example, may be 2000 angstroms. The thickness d2 of the planarization layer 301 may range from 1 micrometer to 3 micrometers, for example, may be 2 micrometers. The thickness d3 of the lead structure 03 may range from 7000 angstroms to 8000 angstroms, for example, may be 7500 angstroms. The thickness d4 of the flexible layer 051 may be larger than 2 micrometers (for example, being equal to 3 micrometers). The thickness d5 of the adhesive 303 may range from 5 micrometers to 30 micrometers, for example, may be 20 micrometers. Additionally, when the thickness d1 of the auxiliary film layer 302 may be 2000 angstroms, the thickness d2 of the planarization layer 301 may be 2 micrometers, the thickness d3 of the lead structure 03 may be 7500 angstroms, and the thickness d4 of the flexible layer 051 is equal to 3 micrometers, a sum D of the thicknesses of the planarization layer 051, the auxiliary film layer 302, the lead structure 03 and the planarization layer 301 is 5.95 micrometers. At the time, the edge of the display panel, on which the array substrate is disposed, is relatively narrow indeed.

Furthermore, when the thicknesses of the flexible layer 051, the auxiliary film layer 302, the lead structure 03 and the planarization layer 301 are set, the lead structure 03 may further be arranged at a neutral layer in the four-layer structure by adjusting the thicknesses of the film layers, and thus the stress applied to the lead structure 03 is relatively weak, and breakage of the lead structure 03 is avoided.

Optionally, the lead structure 03 may be made of any kind of conductive materials, such as TiALTi, Cu or Mo.

Figure 5:
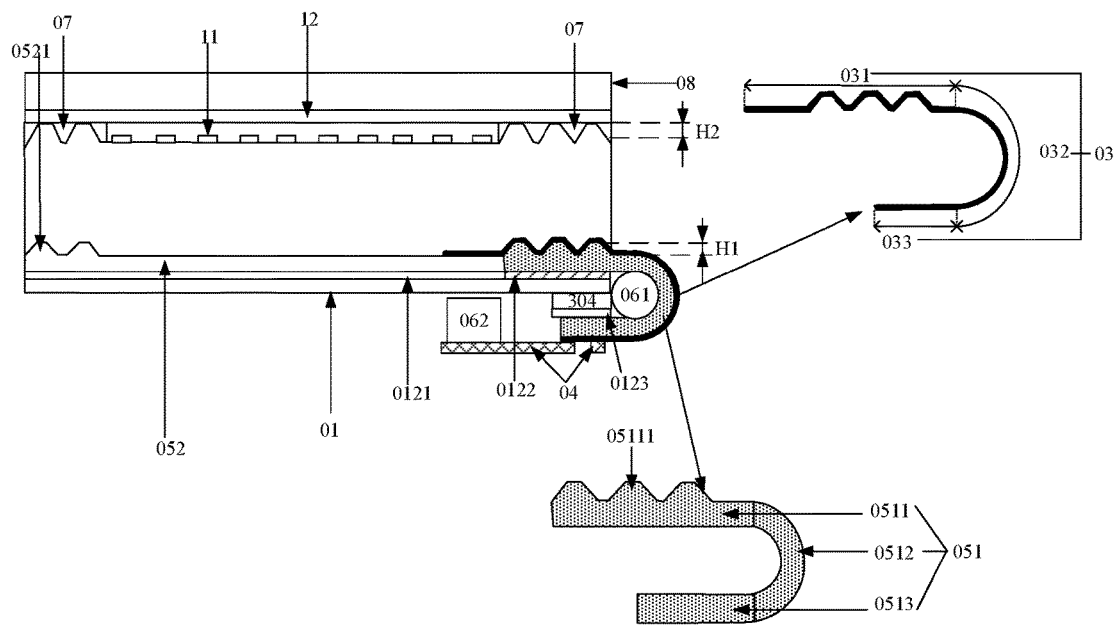
FIG. 5 is a schematic structural diagram of a display panel according to an embodiment of the present disclosure.

Optionally, FIG. 5 is a schematic structural diagram of a display substrate according to an embodiment of the present disclosure. It needs to be noted that, FIG. 5 shows a part of the structure in the display panel only without showing the other part of the structure, for example, the auxiliary film layer 302, the adhesive 303, the planarization layer 301 and the like are not shown. As seen from FIG. 5, the surface, distal from the base substrate 01, of the first substrate portion 0511 in the flexible layer 051 is provided with a first protrusion 05111. Optionally, the surface, distal from the base substrate 01, of the first substrate portion 0511 in the flexible layer 051 may further be a plane, which is not limited in the embodiment of the present disclosure. The first protrusion 05111 is arranged on the first side 21 of the base substrate 01, and an orthographic projection of the first protrusion 05111 on the base substrate 01 has an overlapping region with an orthographic projection of a sealant 07 on the base substrate 01, and the sealant 07 is used for sealing the array substrate 01 and a cover plate 08 arranged on a side, distal from the base substrate 01, of the pixel circuit 02.

Figure 6:
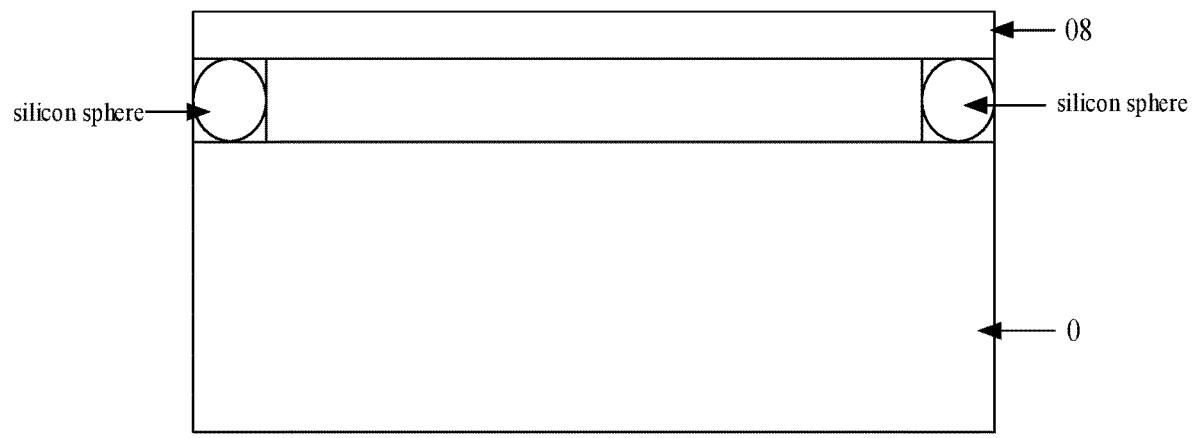
FIG. 6 is a schematic structural diagram of a display panel according to related art.

When the surface, distal from the base substrate 01, of the first substrate portion 0511 in the flexible layer 051 is provided with the first protrusions 05111, under the effect of the first protrusion 05111, a structure between the flexible layer 051 and the sealant 07 (such as a passivation layer (called PVX for short), a planarization layer (also called: PLN), a buffer layer, and an inter-level dielectric layer (called ILD for short)) is also provided with a protrusion. The protrusion (that is a protrusion, which is most distal from the base substrate in the protrusions) in contact with the sealant 07 may be inserted into the sealant 07, and matches with the sealant 07. At the time, the protrusion may exert the effect of supporting the array substrate 07 and the cover plate 08. Compared with the situation that a sealant includes a silicon sphere used for supporting the array substrate 0 and the cover plate 08 as shown in FIG. 6 in the related art, an additional silicon sphere is not required in the embodiment of the present disclosure, and the problem that the surface of the cover plate is not flat and the cover plate is easily broken for the contact between the silicon sphere and the cover plate is single-point contact may be avoided.

Optionally, continuing with reference to FIG. 5, a height H1 of the first protrusion 05111 may be equal to or not equal to a thickness H2 of the sealant 08 in a direction perpendicular to the base substrate 01, which is not limited in the embodiment of the present disclosure. In the embodiment of the present disclosure, the situation that the height H1 of the first protrusion 05111 is equal to the thickness H2 of the sealant 08 in the direction perpendicular to the base substrate 01 is taken as an example. At the time, a surface, distal from the base substrate, of the protrusion which is formed under the effect of the first protrusion 05111 and in contact with the sealant 08 may be directly in contact with the cover plate 08, and thus the effect of effectively supporting the cover plate 08 is achieved.

Optionally, the height of the first protrusion 05111 in the flexible layer 051 may range from 3 micrometers to 5 micrometers. For example, the height of the first protrusion 05111 is 3 micrometers, and at the time, a thickness of a position may be 5 micrometers, where the first protrusion 05111 is disposed on the flexible layer 051.

Figure 7:
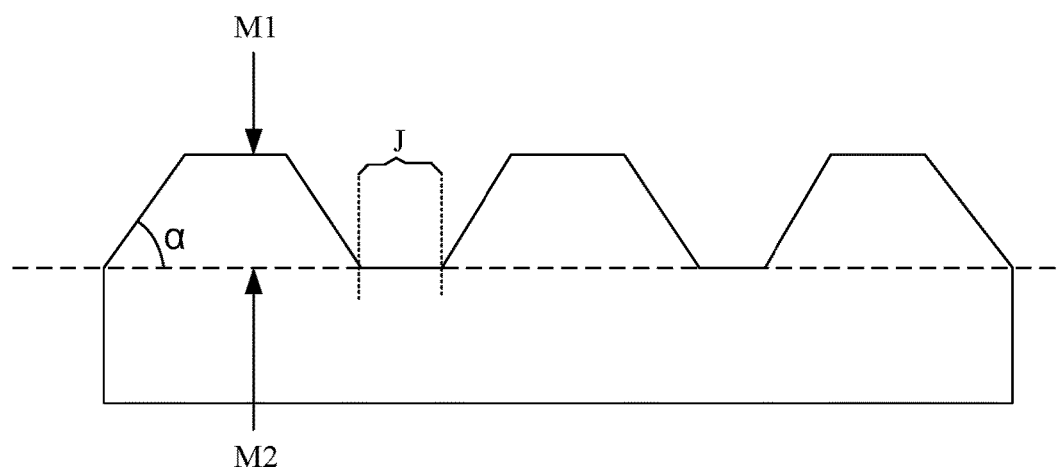
FIG. 7 is a schematic structural diagram of a first protrusion according to the present disclosure.

Optionally, as shown in FIG. 7, an orthographic projection of a side M1, distal from of the base substrate 01, of the first protrusion 05111 on the base substrate may fall in an orthographic projection of a side M2, proximal to the base substrate 01, of the first protrusion 05111 on the base substrate. For example, the first protrusions 05111 may be in a shape of a pyramid frustum, a hemisphere or a cone frustum, and the situation that the first protrusion 05111 is in the shape of the cone frustum is taken as an example in the embodiment of the present disclosure. At the time, an edge of the first protrusion 05111 is in a shape of an arc line without a corner angle. In this case, portions of other structures (such as the passivation layer, the planarization layer, the buffer layer and the inter-level dielectric layer), which are formed on each first protrusion 05111, are in contact with the edge of the first protrusion 05111 and are not apt to crack because of a generated concentration of stress when an external force is applied.

Optionally, continuing with reference to FIG. 7, a slope angle α of the first protrusion 05111 may be larger than 0 degree and smaller than 90 degrees. Furthermore, the slope angle α may be smaller than 30 degrees. It needs to be noted that, when the slope angle α of the first protrusion 05111 is smaller than 30 degrees, a portion of the flexible layer 051 which does not have the first protrusion 05111 may be in a smooth transition to a portion having the first protrusion 05111. In this way, other structures may be continuously formed on the flexible layer 051 having the slope angle α and formed structures are not apt to be broken due to a height change.

Optionally, the surface, distal from the base substrate 01, of the flexible layer 051 may be provided with one or more first protrusions 05111. As shown in FIG. 7, when the surface, distal from the base substrate 01, of the flexible layer 051 is provided with a plurality of first protrusions 05111, an interval J of any two adjacent first protrusions 05111 may range from 10 micrometers to 40 micrometers. At the time, on one hand, a plurality of protrusions formed under the effect of the plurality of first protrusions 05111 may collectively support the cover plate, and thus the stability of supporting the cover plate and the array substrate by the protrusions is improved; and on the other hand, a contact area between the protrusions and the sealant may be increased with increase of the number of the protrusions, and thus the sealing effect may be effectively improved.

Optionally, when the surface, distal from the base substrate 01, of the flexible layer 051 is provided with a plurality of first protrusions 05111, the plurality of first protrusions 05111 may be or not be arranged in an array, which is not limited in this embodiment of the present disclosure; and in the embodiment of the present disclosure, the situation that the plurality of first protrusions 05111 are arranged in the array is taken as an example.

Figure 8:
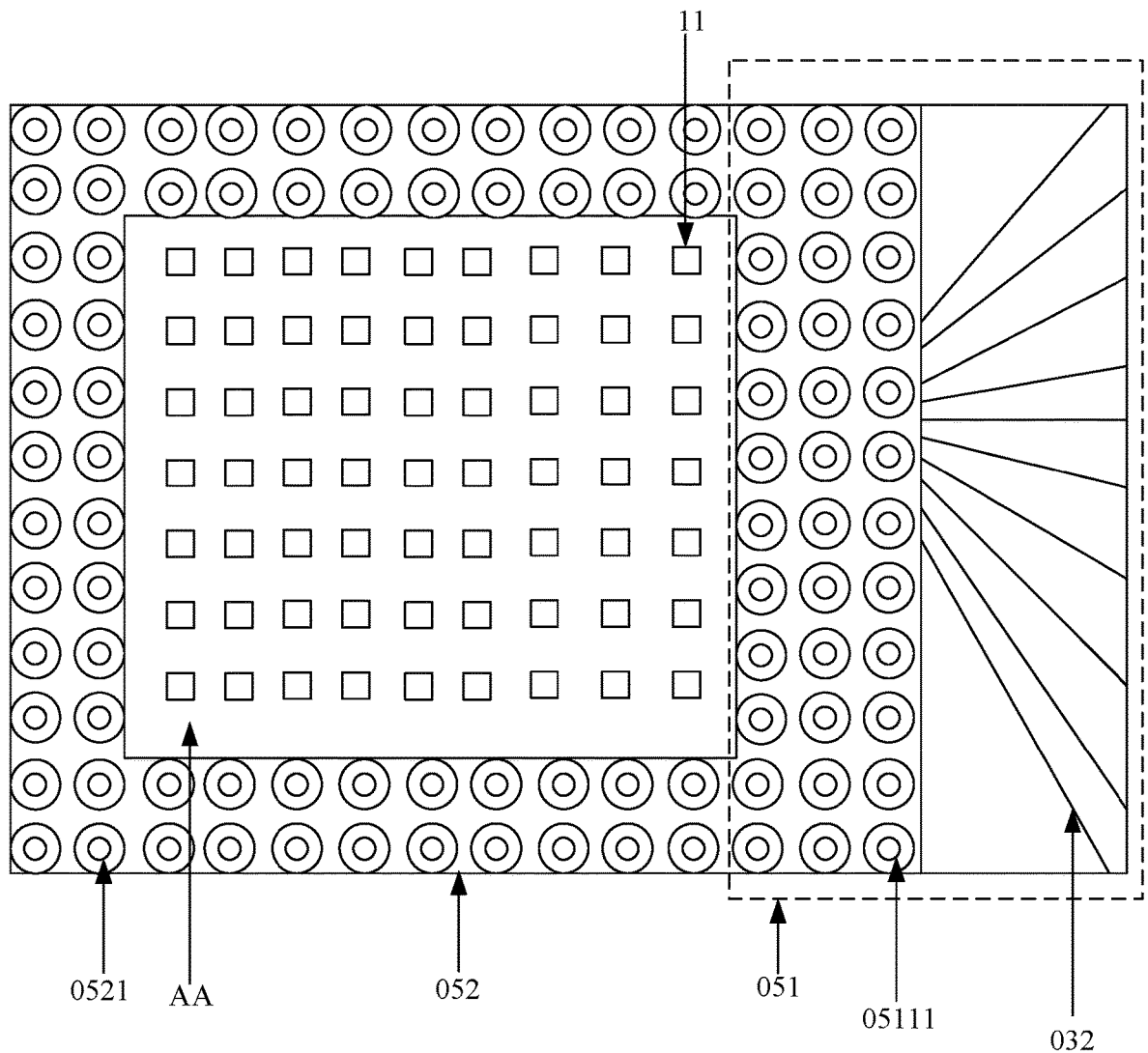
FIG. 8 is a top view of a display panel according to an embodiment of the present disclosure.

Optionally, FIG. 8 is a top view of a display panel in FIG. 5, and it can be seen with combination of FIG. 5 and FIG. 8 that, the array substrate 0 may further include an auxiliary substrate 052. The auxiliary substrate 052 and the flexible layer 051 are arranged at one layer, form an annular shape in an enclosing mode and surround a display region AA of the base substrate 01 including a pixel electrode 11. The display region AA of the base substrate 01 is half surrounded by the auxiliary substrate 052, the surface, distal from the base substrate 01, of the auxiliary substrate 052 is provided with a second protrusion 0521, and an orthographic projection of the second protrusion 0521 on the base substrate 01 has an overlapping region with an orthographic projection of the sealant 07 on the base substrate 01. A height of the first protrusion 0511 in the flexible layer 051 may be equal to a height of the second protrusion 0521 in the auxiliary substrate 052. At the time, under the supporting of the first protrusion 05111 and the second protrusion 0521, a distance between the array substrate 01 and the cover plate 08 may be ensured to be the same everywhere, thereby achieving the purpose of realizing a design with uniform box thickness and symmetric four frames.

Optionally, a ratio of a sum of areas of orthographic projections of a top surface of the first protrusion and a top surface of the second protrusion in the array substrate 0 on the base substrate 01 to an area of an orthographic projection of the sealant 07 on the base substrate 01 is larger than two thirds. In this way, the sealing effect may be strengthened while the stability of supporting the cover plate and the array substrate by the protrusions which are formed under the effect of the first protrusion and in contact with the sealant may be further improved.

Optionally, continuing with reference to FIG. 5, a color film layer 12 may further be formed on a side, facing the array substrate, of the cover plate 08 and may be arranged between the cover plate 08 and the sealant 07. Furthermore, liquid crystals (not shown in FIG. 5) may further be filled between the color film layer 12 and the array substrate.

Optionally, the array substrate may further include a light-shielding layer 09, pixel electrodes 11, a transparent conductive layer 13 and the like, as shown in FIG. 2. Optionally, the film layers not marked in the drawings of the description may be all insulating layers.

Optionally, continuing with reference to FIG. 2, the array substrate may further include a bonding substrate 304 arranged between the base substrate 01 and the second substrate portion 0512, and the two ends of the flexible layer 051 are in a lap joint to the base substrate 01 and the bonding substrate 304 respectively. Optionally, the base substrate 01 and the bonding substrate 304 are made of the same material, and the thickness of the base substrate 01 is equal to that of the bonding substrate 304. Additionally, the thicknesses of the base substrate 01 and the bonding substrate 304 may be both smaller than that of the cover plate (the cover plate 08 as shown in FIG. 5) in the display device on which the array substrate is disposed. A sum of the thicknesses of the base substrate 01 and the bonding substrate 304 may be smaller than or equal to that of the cover plate (the cover plate 08 as shown in FIG. 5). When the sum of the thicknesses of the base substrate 01 and the bonding substrate 304 is smaller than that of the cover plate, the thickness of the array substrate is relatively small, the thickness of the display device, on which the array substrate is disposed, is also relatively small, and thus the lightening and thinning of the display device are realized. For example, the thicknesses of the base substrate 01 and the bonding substrate 304 may both be 0.15 mm, 0.16 mm or the like.

Optionally, a bonding cushion layer portion 0123 may be further laminated on the bonding substrate 304, and at the time the target cushion layer 012 may further include the bonding cushion layer portion 0123.

To sum up, in the array substrate provided by the present disclosure, a portion of the flexible layer is fixed to the first side of the base substrate, and the other portion of the flexible layer is curved to the second side, opposite to the first side, in the base substrate. In this way, the lead structure on the flexible layer may further be curved to the second side of the base substrate along with curving of the flexible layer, and thus a width of a portion, occupied by the lead structure, of the first side of the base substrate may be reduced, and the purpose of increasing the screen-to-body ratio by reducing the width of the non-display region of the base substrate is achieved.

FIG. 9 is a flowchart of a method for manufacturing an array substrate according to an embodiment of the present disclosure. The method may be used for manufacturing the array substrate (as shown in FIG. 1 or FIG. 2) according to the embodiment of the present disclosure. As shown in FIG. 9, the manufacturing method may include:

Step 901: a base substrate, a pixel circuit, a lead structure, a flexible layer, a control circuit and a planarization layer are formed. The pixel circuit, the flexible layer, the control circuit and the planarization layer are all arranged on a first side of the base substrate; an orthographic projection of the flexible layer on a reference plane parallel to the base substrate overlaps an orthographic projection portion of the base substrate on the reference plane; the lead structure covers a side, distal from the base substrate, of the flexible layer and is electrically connected to both the pixel circuit and the control circuit; and the planarization layer is arranged on a side, distal from the base substrate, of the pixel circuit and covers the pixel circuit and a portion, distal from the control circuit, in the lead structure.

Step 902: the flexible layer and the lead structure are curved to enable the control circuit to move from the first side of the base substrate to a second side of the base substrate. The second side is opposite to the first side, the curved flexible layer includes a first substrate portion, a curved substrate portion and a second substrate portion which are sequentially connected, the first substrate portion is arranged on the first side of the base substrate, the curved substrate portion is curved from the first side of the base substrate to the second side, and the second substrate portion is arranged on the second side of the base substrate; and the curved lead structure includes a first lead portion, a curved lead portion and a second lead portion which are sequentially connected, the first lead portion is arranged on a side, distal from the base substrate, of the first substrate portion and is electrically connected to the pixel circuit, the curved lead portion is arranged on a side, distal from the base substrate, of the curved substrate portion, the second lead portion is arranged on a side, distal from the base substrate, of the second substrate portion, and the curved planarization layer covers the pixel circuit, the first lead portion and the curved lead portion.

To sum up, in the array substrate manufactured by the method provided by the embodiment of the present disclosure, a portion of the flexible layer is fixed to the first side of the base substrate, and the other portion of the flexible layer is curved to the second side, opposite to the first side, in the base substrate. In this way, the lead structure on the flexible layer may further be curved to the second side of the base substrate along with curving of the flexible layer, and thus a width of a portion, occupied by the lead structure, of the first side of the base substrate may be reduced, thereby achieving the purpose of increasing the screen-to-body ratio by reducing the width of the non-display region of the base substrate.

Figure 10:
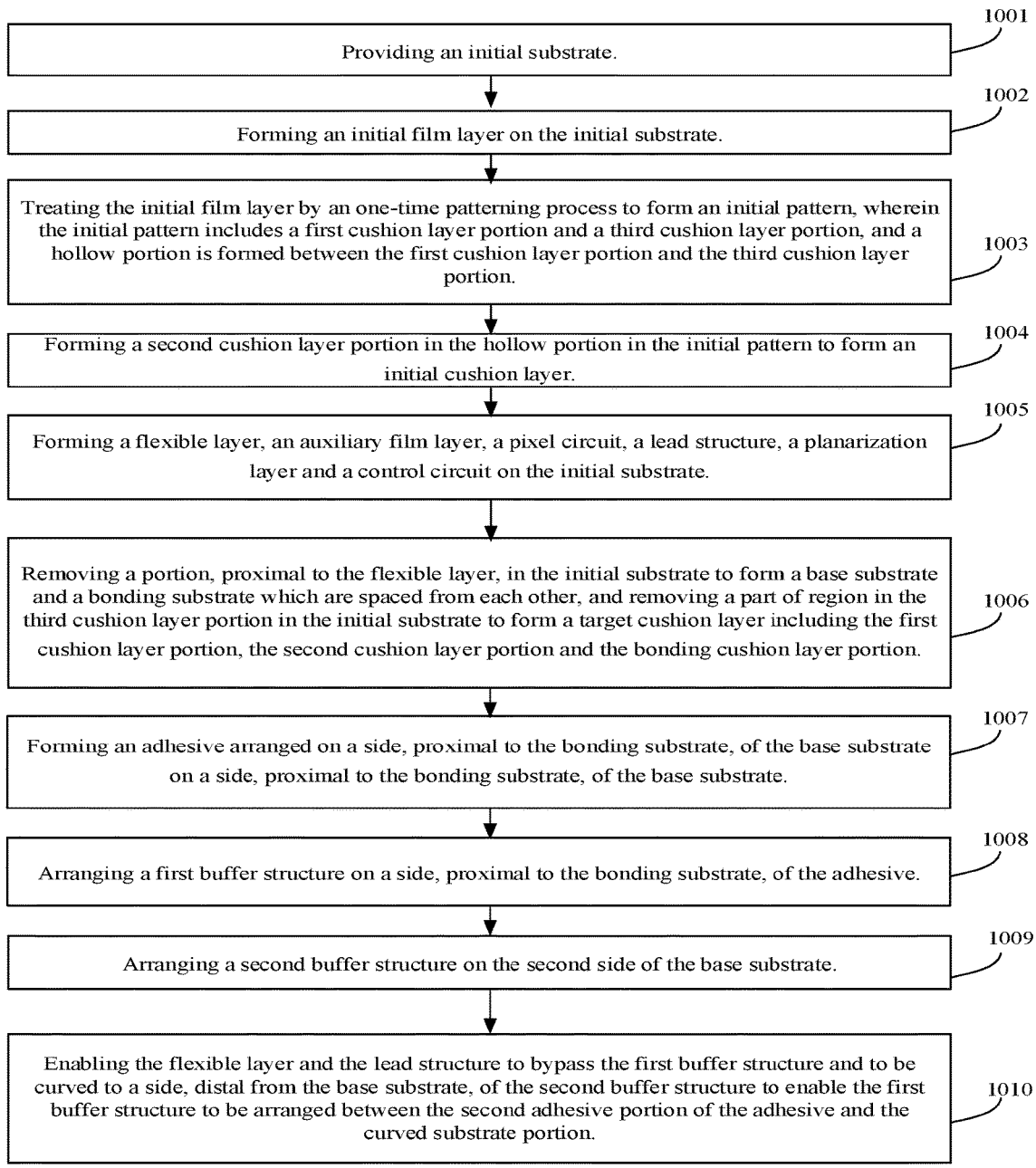
FIG. 10 is a schematic flowchart of another method for manufacturing an array substrate according to an embodiment of the present disclosure.

FIG. 10 is a schematic flowchart of another method for manufacturing an array substrate according to an embodiment of the present disclosure; and the manufacturing method includes:

Step 1001: an initial substrate is provided.

Figure 11:
FIG. 11 is a schematic diagram of a manufacturing process of an array substrate according to an embodiment of the present disclosure.

Before the array substrate is manufactured, the initial substrate 110 as shown in FIG. 11 needs to be provided, and the situation that the initial substrate 110 is a glass substrate is taken as an example in the embodiment of the present disclosure.

Optionally, the initial substrate may be or may not be a substrate produced by performing thinning treatment on other substrates, which is not limited in this embodiment of the present disclosure.

Step 1002: an initial film layer is formed on the initial substrate.

Figure 12:
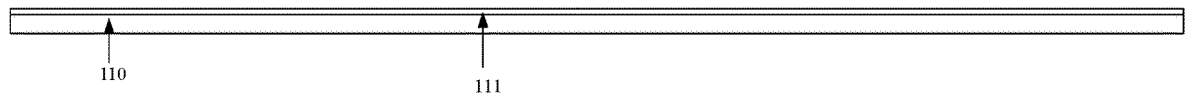
FIG. 12 is a schematic diagram of a manufacturing process of an array substrate according to an embodiment of the present disclosure.

The initial film layer 111, as shown in FIG. 12, is formed on the initial substrate and covers the initial substrate 110, and the initial film layer may be called as a de-bonding layer (DBL).

For example, when the initial film layer 111 is formed, a coating method, a physical vapor deposition (PVD) method or a chemical vapor deposition (CVD) method may be adopted. The PVD includes magnetron sputtering, thermal evaporation or other physical deposition methods. The CVD includes a plasma enhanced chemical vapor Deposition (PECVD) method and other chemical deposition methods.

Step 1003: the initial film layer is treated by a one-time patterning process to form an initial pattern, wherein the initial pattern includes a first cushion layer portion and a third cushion layer portion, and a hollow portion is formed between the first cushion layer portion and the third cushion layer portion.

Figure 13:
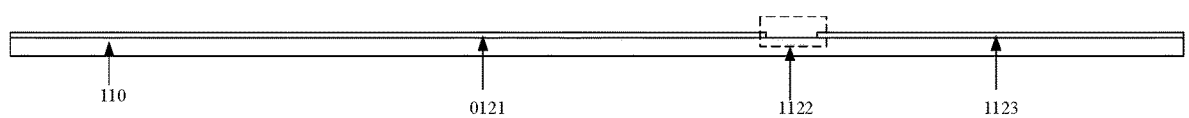
FIG. 13 is a schematic diagram of a manufacturing process of an array substrate according to an embodiment of the present disclosure.

After the initial film layer is formed, the initial film layer may be treated by the one-time patterning process to form the initial pattern 112 as shown in FIG. 13. The initial pattern 112 includes: the first cushion layer portion 0121 and the third cushion layer portion 1123, and the hollow portion 1122 is formed between the first cushion layer portion 0121 and the third cushion layer portion 1123.

The treating the initial film layer by the one-time patterning process includes the initial film layer is coated with a layer of photoresist. Then the photoresist is exposed by a mask and forms an exposure region and a non-exposure region. Then a development process is performed to remove the photoresist in one region of the exposure region and the non-exposure region to be removed and remain the photoresist in the other region. Then the region, not covered with the photoresist, of the initial film layer is etched, and after etching is finished, the photoresist on the initial film layer is stripped and thus the initial pattern 112 may be formed. It needs to be noted that, the photoresist may be a positive photoresist or a negative photoresist. If the photoresist is the positive photoresist, after the development process is performed, the photoresist in the exposure region is removed, and the photoresist in the non-exposure region remains. If the photoresist is the negative photoresist, after the development process is performed, the photoresist in the non-exposure region is removed, and the photoresist in the exposure region remains.

Step 1004: a second cushion layer portion is formed in the hollow portion in the initial pattern to form an initial cushion layer.

Figure 14:
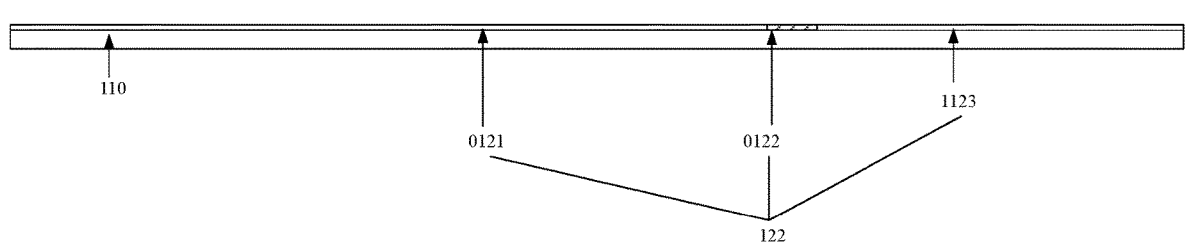
FIG. 14 is a schematic diagram of a manufacturing process of an array substrate according to an embodiment of the present disclosure.

After the initial pattern is formed, the second cushion layer portion 0122, as shown in FIG. 14, is formed in the hollow portion in the initial pattern to form the initial cushion layer 122. The initial cushion layer 122 includes: the first cushion layer portion 0121, the second cushion layer portion 0122 and the third cushion layer portion 1123 which are sequentially arranged. Additionally, the viscosity of the second cushion layer portion 0122 in the initial cushion layer 122 is larger than that of the first cushion layer portion 0121. Optionally, the viscosity of the second cushion layer portion 0122 in the initial cushion layer 122 is larger than those of the first cushion layer portion 0121 and the third cushion layer portion 1123.

It needs to be noted that, when the second cushion layer portion is being formed, the methods in the steps 1003-1004 may also not be adopted, and instead a method of irradiating a portion to be modified in the initial film layer by ultraviolet (called UV for short) to form the second cushion layer portion may be adopted.

Step 1005: the flexible layer, the auxiliary film layer, the pixel circuit, the lead structure, the planarization layer and the control circuit are formed on the initial substrate.

Figure 15:
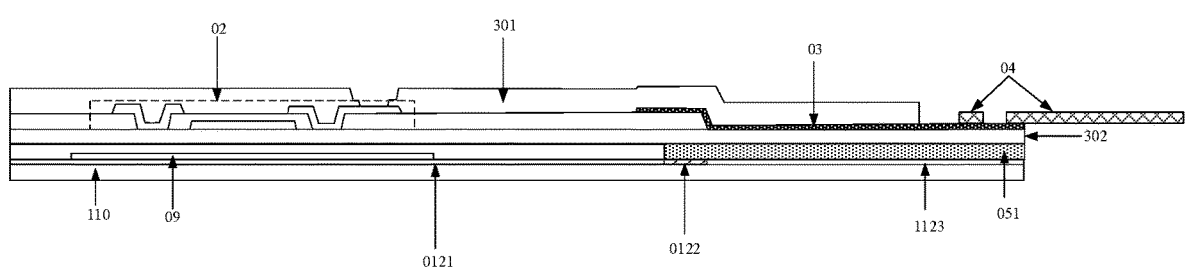
FIG. 15 is a schematic diagram of a manufacturing process of an array substrate according to an embodiment of the present disclosure.
Figure 16:
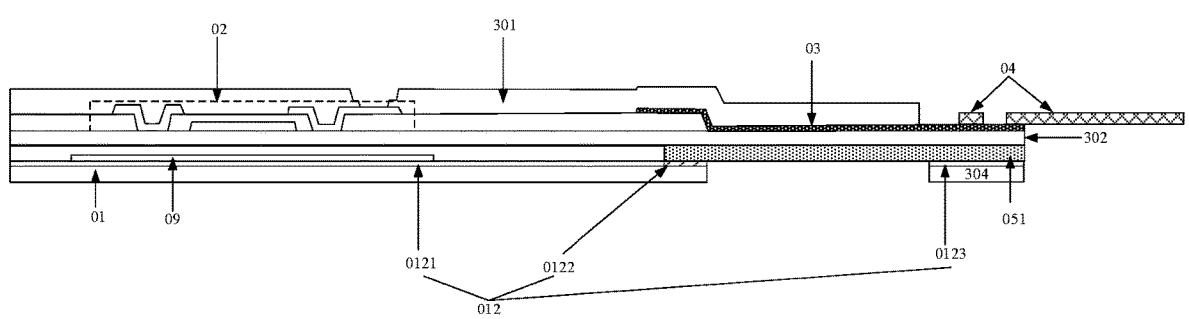
FIG. 16 is a schematic diagram of a manufacturing process of an array substrate according to an embodiment of the present disclosure.

After the initial substrate is obtained, the flexible layer 051, the auxiliary film layer 302, the pixel circuit 02, the lead structure 03, the planarization layer 301 and the control circuit 04, as shown in FIG. 15, may be formed on the initial substrate. The control circuit 04 may include a chip arranged on a polyimide (called PI for short) film layer (a structure consisting of the PI and the chip arranged thereon may be called COP).

Step 1006: a portion, proximal to the flexible layer, in the initial substrate is removed to form the base substrate and the bonding substrate which are spaced from each other, and a part of region in the third cushion layer portion in the initial substrate is removed to form the target cushion layer including the first cushion layer portion, the second cushion layer portion and the bonding cushion layer portion.

Figure 19:
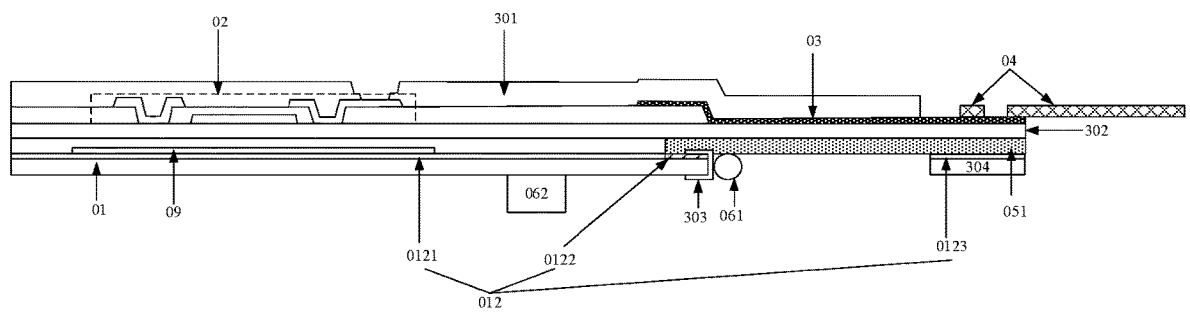
FIG. 19 is a schematic diagram of a manufacturing process of an array substrate according to an embodiment of the present disclosure.

The two ends of the flexible layer are in a lap joint to the base substrate and the bonding substrate respectively. After the control circuit is electrically connected to one end, distal from the pixel circuit, of the lead structure, the portion, proximal to the flexible layer, in the initial substrate may be removed and form the base substrate 01 and the bonding substrate 304 as shown in FIG. 19, and a part of region in the third cushion layer portion in the initial substrate is removed and form the target cushion layer 012 as shown in FIG. 19. At the time, one end, proximal to the first cushion layer portion 0121 in the target cushion layer 012, of the flexible layer 051 is arranged on the base substrate 01, and the other end, distal from the first cushion layer portion 0121, of the flexible layer 051 is arranged on the auxiliary substrate 304.

Step 1007: an adhesive arranged on a side, proximal to the bonding substrate, of the base substrate is formed on a side, proximal to the bonding substrate, of the base substrate.

Figure 17:
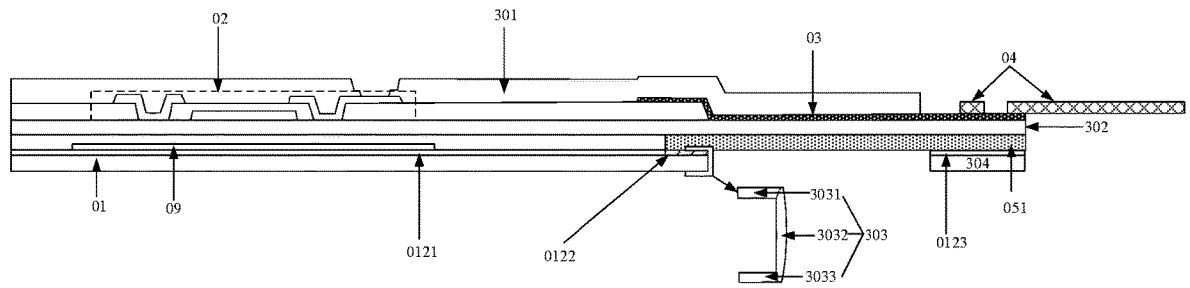
FIG. 17 is a schematic diagram of a manufacturing process of an array substrate according to an embodiment of the present disclosure.

For example, as shown in FIG. 17, the adhesive 303 includes: a first adhesive portion 3031, a second adhesive portion 3032 and a third adhesive portion 3033 which are sequentially connected. The first adhesive portion 3031 is arranged on a first side of the base substrate 01 (that is the first side where the pixel circuit is formed), the second adhesive portion 3032 is arranged on a side of the base substrate 01 where the base substrate 01 faces the bonding substrate 304 and the third adhesive portion 3033 is arranged on a second side of the base substrate 01 (that is a side opposite to the side where the pixel circuit is formed).

When the adhesive is formed, a side of the base substrate which is proximal to the bonding substrate may be coated with a colloid firstly, and then the colloid may diffuse to the first side and the second side of the base substrate respectively to form the adhesive.

Step 1008: a first buffer structure is arranged on a side, proximal to the bonding substrate, of the adhesive.

Figure 18:
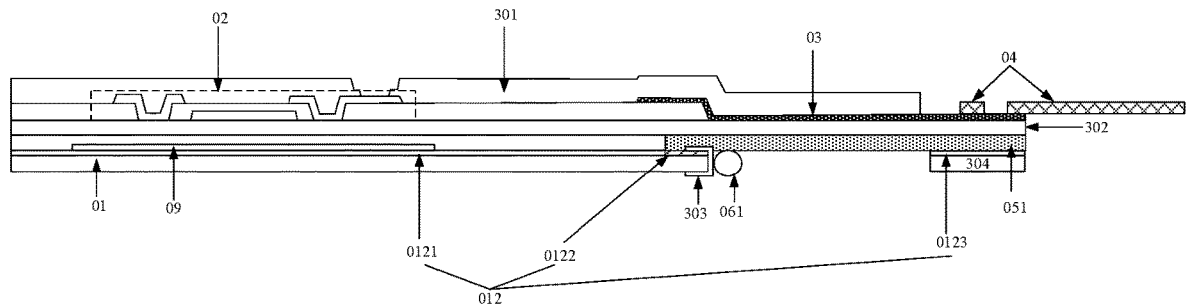
FIG. 18 is a schematic diagram of a manufacturing process of an array substrate according to an embodiment of the present disclosure.

For example, the first buffer structure 061, as shown in FIG. 18, is arranged on the side, proximal to the bonding substrate, of the adhesive. In the embodiment of the present disclosure, the situation that the first buffer structure 061 is in a sphere shape is taken as an example. For example, the first buffer structure may be made of foams, plastics, a flexible material or the like.

Step 1009: a second buffer structure is arranged on the second side of the base substrate.

After the first buffer structure is arranged, the second buffer structure 062, as shown in FIG. 19, may be arranged on the second side of the base substrate; and in the embodiment of the present disclosure, the situation that the second buffer structure is a cuboid and is made of the same material as the first buffer structure is taken as an example.

Step 1010: the flexible layer and the lead structure bypass the first buffer structure and are curved to a side, distal from the base substrate, of the second buffer structure to enable the first buffer structure to be arranged between the second adhesive portion of the adhesive and the curved substrate portion.

After the second buffer structure is arranged on the second side of the base substrate, the flexible layer and the lead structure bypass the first buffer structure and are curved to the side, distal from the base substrate, of the second buffer structure to enable the first buffer structure to be arranged between the second adhesive portion of the adhesive and the curved substrate portion to form the schematic structural diagram of the array substrate as shown in FIG. 2.

It needs to be noted that, when the array substrate does not include the first buffer structure, the step 1008 in FIG. 10 may not be executed. When the array substrate does not include the second buffer structure, the step 1009 in FIG. 10 may not be executed. When the array substrate does not include the adhesive, the step 1007 may not be executed; and when the array substrate does not include the auxiliary film layer, the auxiliary film layer may not be formed in the step 1005 either.

Optionally, in the embodiment, the situation that the array substrate does not include the auxiliary substrate 052 as shown in FIG. 5 and FIG. 8 is taken as an example. When the array substrate includes the auxiliary substrate, the auxiliary substrate may be formed while the flexible layer is formed. At the time, the process of forming the auxiliary substrate and the flexible layer may include: firstly, a flexible material layer may be formed on the initial substrate with reference to the method of forming the initial film layer in the step 1002, and the flexible material layer may be made of polyimide (called PI for short). Then, patterning treatment may be performed on the flexible material layer to form the flexible layer and the auxiliary substrate. The surface, distal from the initial substrate, of the flexible layer is provided with first protrusions, the surface, distal from the initial substrate, of the auxiliary substrate is provided with second protrusions, and the first protrusions and the second protrusions are partially or wholly arranged in a region, in which a sealant is to be formed, on the initial substrate.

To sum up, in the array substrate manufactured by the method provided by the embodiment of the present disclosure, a portion of the flexible layer is fixed to the first side of the base substrate, and the other portion of the flexible layer is curved to the second side, opposite to the first side, in the base substrate. In this way, the lead structure on the flexible layer may further be curved to the second side of the base substrate along with curving of the flexible layer, and thus a width of a portion, occupied by the lead structure, of the first side of the base substrate may be reduced, and the purpose of increasing the screen-to-body ratio by reducing the width of the non-display region of the base substrate is achieved.

The embodiment of the present disclosure provides a display panel, and the display panel may include the array substrate (as shown in FIG. 1 or FIG. 2) provided by the embodiment of the present disclosure.

Optionally, as shown in FIG. 5, the display panel may further include: a cover plate 08 and a sealant 07. The cover plate 08 is arranged on a side, distal from the base substrate, of the pixel circuit, and the sealant 07 seals the array substrate 0 and the cover plate 08. The array substrate 0 may include a base substrate 01, a pixel circuit 02, a lead structure 03, a control circuit 04 and a planarization layer 051. The surface, distal from the base substrate 01, of an auxiliary substrate 051 is provided with first protrusions 05111, the first protrusions 05111 are arranged on a first side 21 of the base substrate 01, and orthographic projections of the first protrusions 05111 on the base substrate 01 have an overlapping region with an orthographic projection of the sealant 07 on the base substrate 01.

Optionally, the array substrate 0 in the display panel may further include the auxiliary substrate 052, and the auxiliary substrate 052 and the flexible layer 051 are arranged at one layer. The surface, distal from the base substrate 01, of the auxiliary substrate 052 is provided with second protrusions 0521, and an orthographic projection of the second protrusions 0521 on the base substrate 01 has an overlapping region with an orthographic projection of the sealant 07 on the base substrate 01.

The embodiment of the present disclosure provides a display device. The display device may include the display panel (as shown in FIG. 5) provided by the embodiments of the present disclosure. The display device may be: any products or parts with a display function, such as a liquid crystal panel, an organic light-emitting diode (called OLED for short) panel, a light-emitting diode (called LED for short) panel, a quantum dot panel, electronic paper, a mobile phone, a tablet personal computer, a television, a display, a notebook computer, a digital photo frame, a navigator, etc. The LED panel may be a micro light-emitting diode (called Micro-LED for short) panel, a mini light-emitting diode (called Mini-LED for short) panel or the like.

It is pointed out that in the drawings, the sizes of layers and regions are exaggerated for clarity of illustration. Moreover, it can be understood that, when an element or a layer is referred to as being "on" another element or another layer, it can be directly on the other element, or intervening elements may also be present. Furthermore, it can be understood that, when an element or a layer is referred to as being "under" another element or another layer, it can be directly under the other element, or more than one intervening elements may also be present. Furthermore, it can also be understood that, when a layer or an element is referred to as being "between" two layers or elements, it can be the only layer between the two layers or the two elements, or more than one intervening layers or elements may also be present. Like reference numerals indicate like elements throughout.

In the present disclosure, terms like "first" and "second" are only used for description, not be considered as a designation or designation of relative importance. A term like "multiple" means two or more than two, unless otherwise specifically defined.

It should be noted that, the method embodiments according to the embodiments of the present disclosure can be cross-referenced with each other, which are not limited in the embodiments of the present disclosure. The sequence of the steps of the embodiments of the method provided by the embodiments of the present disclosure may be properly adjusted, the steps may be increased or reduced correspondingly according to the conditions, and any methods which those skilled in the art may think in the technical scope disclosed by the present disclosure should be covered within the protection scope of the present disclosure, thus it will not be elaborated.

The descriptions above are only optional embodiments of the present disclosure, but are not intended to limit the present disclosure; and any modifications, equivalent substitutions, improvements and the like made within the spirit and principles of the present disclosure are all intended to be concluded in the protection scope of the present disclosure.

The invention claimed is:

1. An array substrate, comprising: a base substrate, a lead structure, a control circuit, and a flexible layer; wherein
the flexible layer comprises a first substrate portion, a curved substrate portion and a second substrate portion which are sequentially connected, a first substrate portion is arranged on a first side of the base substrate, the curved substrate portion is curved from the first side of the base substrate to a second side, and the second substrate portion is arranged on the second side of the base substrate, the second side is opposite to the first side; and
the lead structure comprises a first lead portion, a curved lead portion and a second lead portion which are sequentially connected, the first lead portion is arranged on a side, distal from the base substrate, of the first substrate portion and is electrically connected to the pixel circuit, the curved lead portion is arranged on a side, distal from the base substrate, of the curved substrate portion, and the second lead portion is arranged on one side, distal from the base substrate, of the second substrate portion and is electrically connected to the control circuit arranged on the second side of the base substrate.

2. The array substrate according to claim 1, wherein the array substrate comprises a pixel circuit; and
the pixel circuit is arranged on the first side of the base substrate and the pixel circuit is electrically connected to the first lead portion.

3. The array substrate according to claim 2, wherein the array substrate further comprises a target cushion layer; and
the target cushion layer comprises a first cushion layer portion and a second cushion layer portion, the pixel circuit is arranged on a side, distal from the base substrate, of the first cushion layer portion, and the first substrate portion is arranged on a side, distal from the base substrate, of the second cushion layer portion.

4. The array substrate according to claim 2, wherein the array substrate further comprises a planarization layer; and
the planarization layer is arranged on a side, distal from the base substrate, of the pixel circuit and covers the pixel circuit, the first lead portion and the curved lead portion.

5. The array substrate according to claim 1, wherein base substrate is a rigid substrate.

6. The array substrate according to claim 1, wherein the array substrate further comprises an auxiliary film layer arranged between the flexible layer and the lead structure.

7. The array substrate according to claim 1, wherein the surface, distal from the base substrate, of the first substrate portion is provided with a first protrusion;
an orthographic projection of the first protrusion on the base substrate has an overlapping region with an orthographic projection of a sealant on the base substrate, and the sealant is used for sealing the array substrate and a cover plate arranged on the side, distal from the base substrate, of the pixel circuit.

8. The array substrate according to claim 7, wherein a height of the first protrusion is equal to a thickness of the sealant in a direction perpendicular to the base substrate.

9. The array substrate according to claim 7, wherein the array substrate further comprises an auxiliary substrate;
the auxiliary substrate and the flexible layer are arranged at one layer, form an annular shape in an enclosing manner and surround a display region of the base substrate; and
a surface, distal from the base substrate, of auxiliary substrate is provided with a second protrusion, and an orthographic projection of the second protrusion on the base substrate has an overlapping region with an orthographic projection of the sealant on the base substrate.

10. The array substrate according to claim 9, wherein a ratio of a sum of areas of orthographic projections of a top surface of the first protrusion and a top surface of the second protrusion on the base substrate in the array substrate to an area of an orthographic projection of the sealant on the base substrate is larger than two thirds.

11. The array substrate according to claim 1, wherein the array substrate further comprises an adhesive; and
the adhesive comprises a first adhesive portion, a second adhesive portion and a third adhesive portion which are sequentially connected, wherein the first adhesive portion is arranged between the base substrate and the first substrate portion, the second adhesive portion is arranged between the base substrate and the curved substrate portion, and the third adhesive portion is arranged between the base substrate and the second substrate portion.

12. The array substrate according to claim 11, wherein the array substrate further comprises a first buffer structure, and the first buffer structure is arranged between the second adhesive portion and the curved substrate portion.

13. The array substrate according to claim 1, wherein the array substrate further comprises a second buffer structure; and
the second buffer structure is arranged between the base substrate and the control circuit, and an orthographic projection of the second buffer structure on the base substrate has an overlapping region with an orthographic projection of the control circuit on the base substrate.

14. The array substrate according to claim 1, wherein the curved lead portion is arranged in a fan-out region in the lead structure, and the second lead portion is provided with a pin which is electrically connected to the control circuit.

15. The array substrate according to claim 2, wherein one end, proximal to the first cushion layer portion, of the second cushion layer portion is flush with one end, proximal to the first cushion layer portion, of the first substrate portion, and one end, distal from the first cushion layer portion, of the second cushion layer portion is flush with one end, distal from the first cushion layer portion, of the base substrate.

16. The array substrate according to claim 1, wherein the array substrate further comprises a bonding substrate arranged between the base substrate and the second substrate portion.

17. The array substrate according to claim 16, wherein the base substrate and the bonding substrate are made of a same material, and a thickness of the base substrate is equal to that of the bonding substrate.

18. A display panel, comprising the display substrate according to claim 1.

19. The display panel according to claim 18, wherein the display panel is a micro light-emitting panel or a mini light-emitting diode panel.

20. A display device, comprising the display panel according to claim 18.

* * * * *